United States Patent
Kretz et al.

[11] 4,292,651
[45] Sep. 29, 1981

[54] EXPANSION AND COMPRESSION OF TELEVISION SIGNALS BY USE OF DIFFERENTIAL CODING

[76] Inventors: Francis Kretz, 5 rue de la Coer'x-Connue, 35510 Cesson-Sevigne; Jean-Louis Boudeville, 6 rue de la Cotiniére, 35500 Vitre, both of France

[21] Appl. No.: 10,694

[22] Filed: Feb. 9, 1979

[30] Foreign Application Priority Data

Dec. 8, 1978 [FR] France ............... 78 35485

[51] Int. Cl.³ .................................. H04N 7/12
[52] U.S. Cl. ..................... 358/135; 375/27
[58] Field of Search .......... 358/135, 136; 325/38 B; 375/27, 28

[56] References Cited

U.S. PATENT DOCUMENTS

| | | | |
|---|---|---|---|
| 3,151,296 | 9/1964 | Phyfe | 325/38 B |
| 3,354,267 | 11/1967 | Crater | 325/38 B |
| 3,403,226 | 9/1968 | Wintringham | 358/135 |
| 3,662,266 | 5/1972 | Limb et al. | 325/38 B |
| 3,707,680 | 12/1972 | Gabbard et al. | 358/135 |
| 3,781,685 | 12/1973 | Ching | 325/38 B |
| 4,093,962 | 6/1978 | Ishiguro et al. | 358/135 |
| 4,200,886 | 4/1980 | Musmann et al. | 358/260 |

FOREIGN PATENT DOCUMENTS 2124060 11/1971 Fed. Rep. of Germany .
2643761 4/1978 Fed. Rep. of Germany .

OTHER PUBLICATIONS

Kretz et al.–Degradation des Signaux d'Images et Qualite Subjective en Codage Numerique; Visibilite du Flottement de Contour–Ann. Telecommunic-1976, pp. 1/24-23/24.
Poncin et al.–Systeme de Codage Numerique de l'Image de Television le Projet OCCITAN-l'Echo des Recherches-Jan. 1976, pp. 28-37.
Von B. Wendland et al.–Ein Adaptiver Intra Frame-Codierer fur Fernsehsignale Radio Mentor Electronic-1973, p. 737.
Kersten-Experimente zur Nachrichten Reduktion bgi Bildfernsprechsignalen Int. Elek. Rundschau, 1973, Nr 1, vol. 27, pp. 8-12.
Musmann-Source Encoding with Fixed Word Length and Synchronous Bit Rate-pp. 27E-1 to 27E-6.
Musmann-A Comparison of Extended Differential Coding Schemes for Video Signals-1974, Zurich Seminar, pp. CL 1 to 7.

*Primary Examiner*—Joseph A. Orsino, Jr.
*Attorney, Agent, or Firm*—Laff, Whitesel & Rockman

[57] ABSTRACT

The encoding of television signals, to be either processed or transmitted in numerical form, uses a modulation of differential code impulses (PDCM). There is a quantizing characteristic which makes it possible to reduce the numerical flow of signals to be either processed or transmitted. At least partially, the quantizing characteristic is non-symmetrical relative to zero, as far as the number and the values of the thresholds and of the reconstruction difference levels are concerned. Numerical examples are given in the specification. According to a variation of the invention, the quantizing characteristic varies as a function of a prediction value $P_n$. The prediction zones are not symmetrical relative to the half-dynamic of the prediction $P_n$. The quantizing characteristics are segments of a wide characteristic which preferably is non-symmetrical.

11 Claims, 13 Drawing Figures

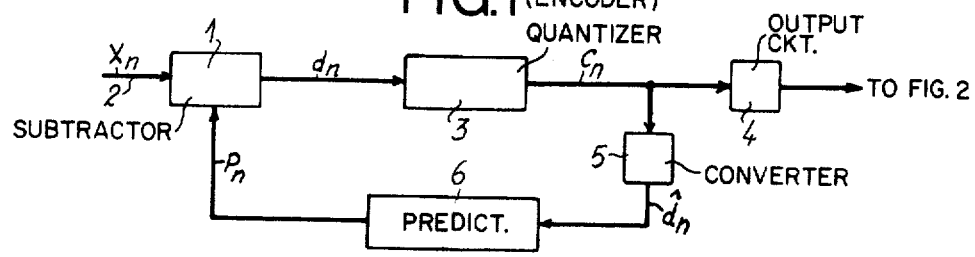
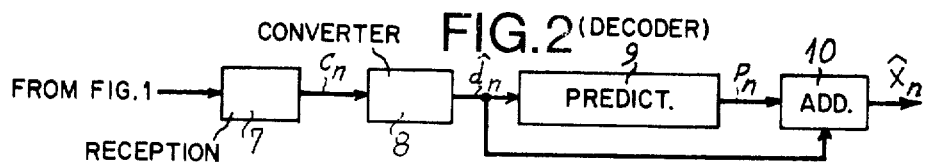
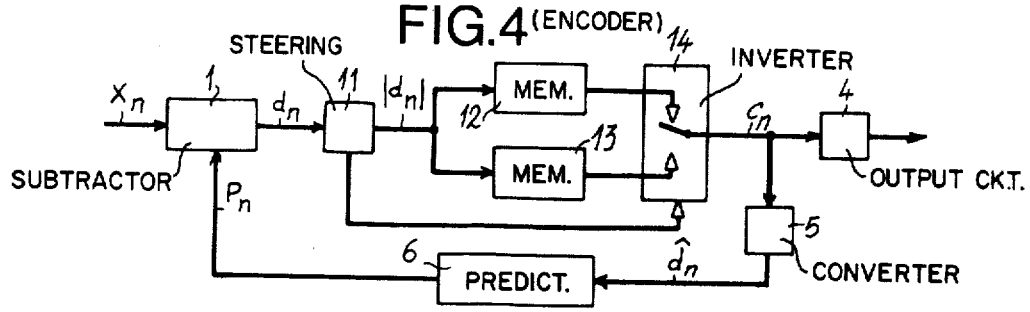
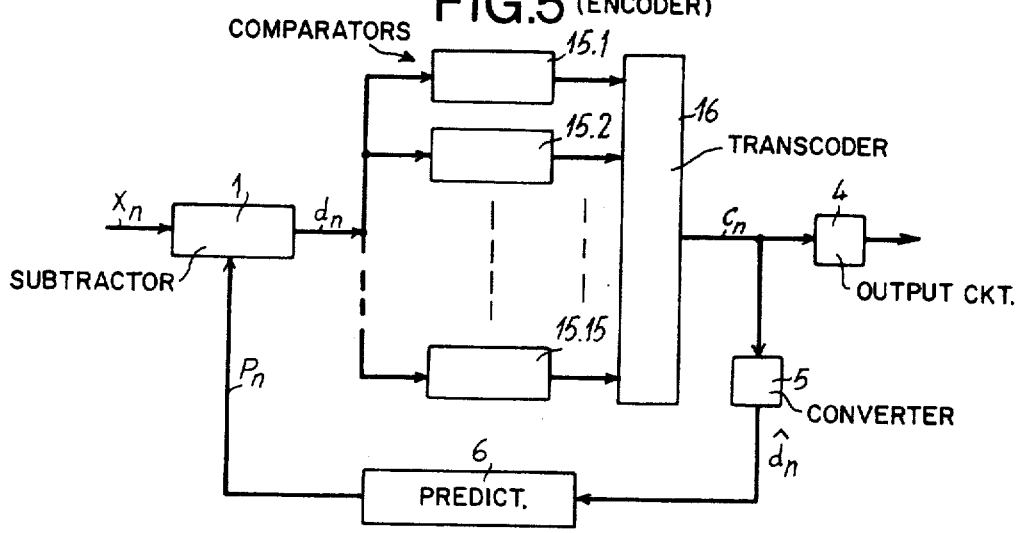

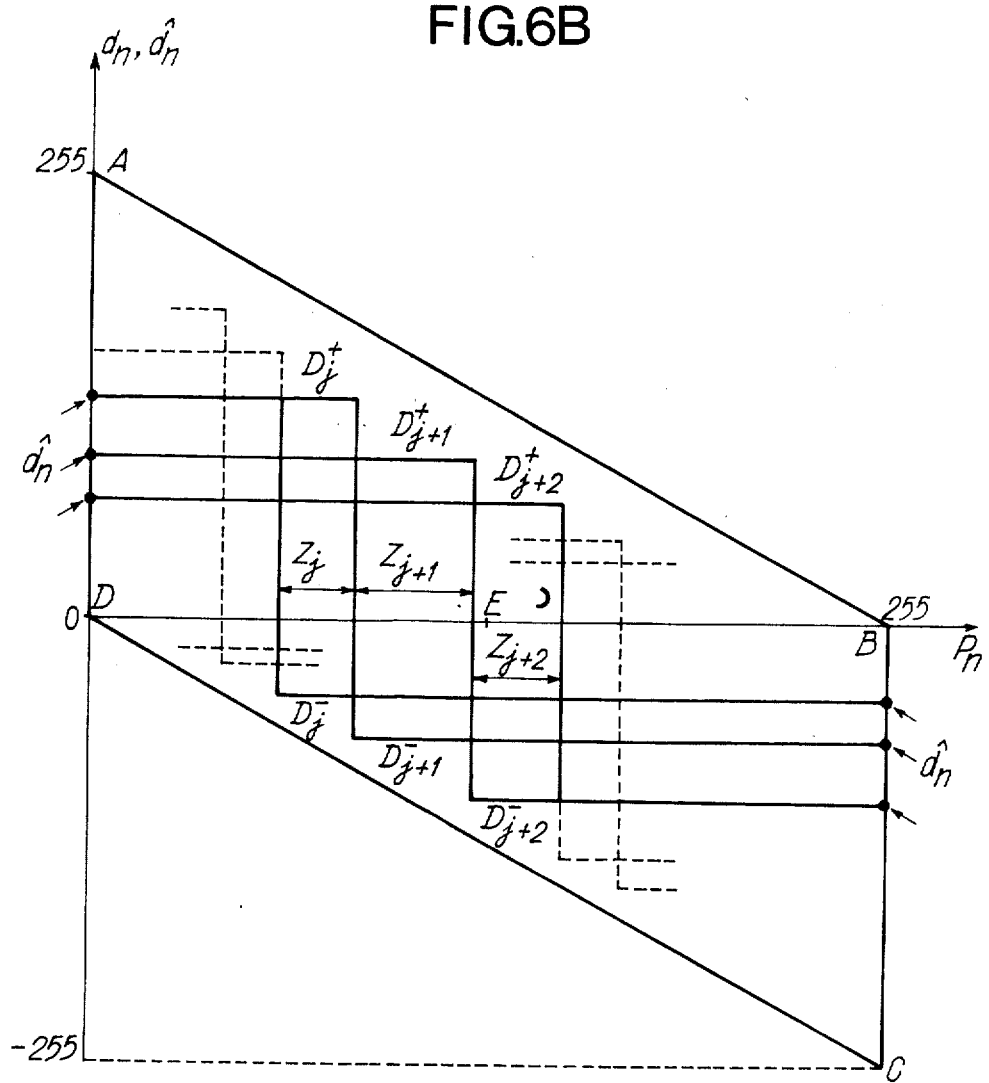

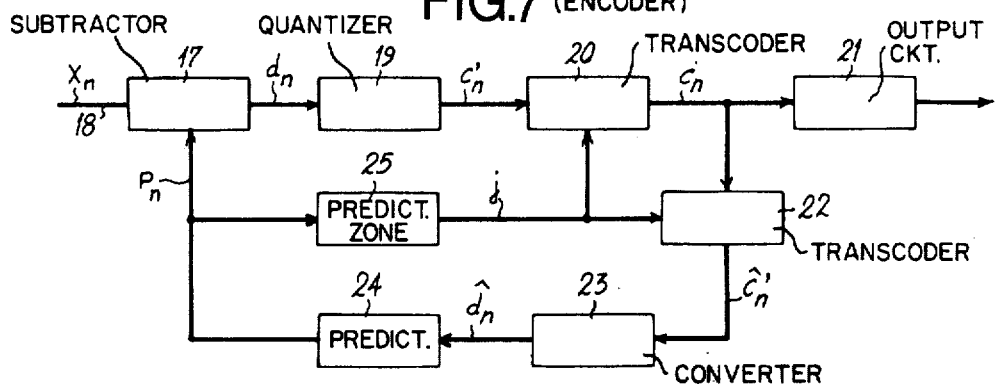
FIG.7 (ENCODER)
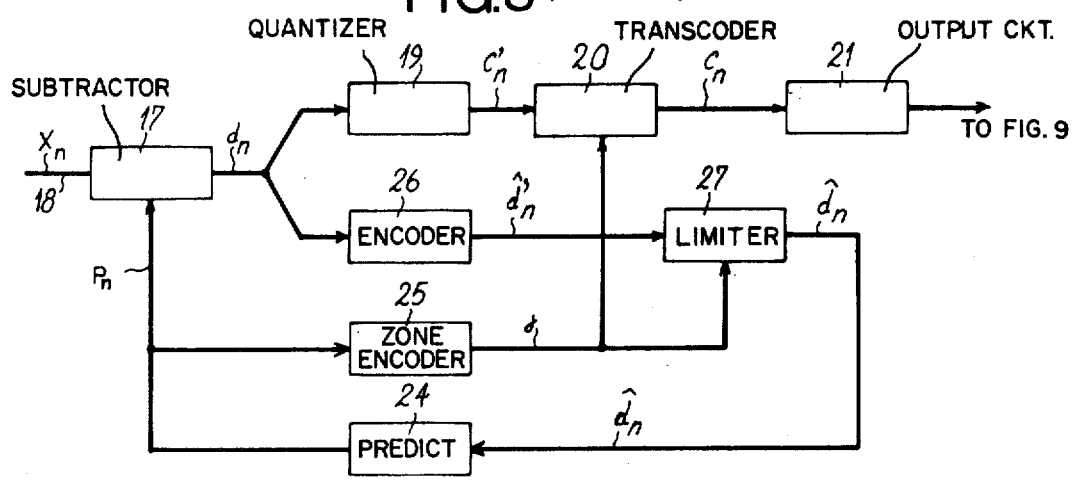
FIG.8 (ENCODER)
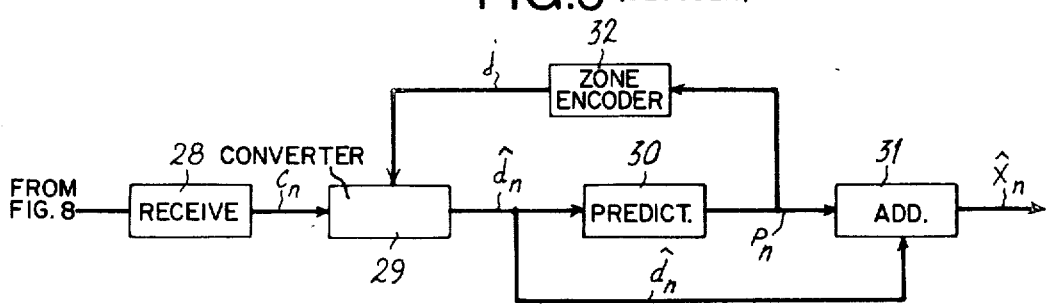
FIG.9 (DECODER)

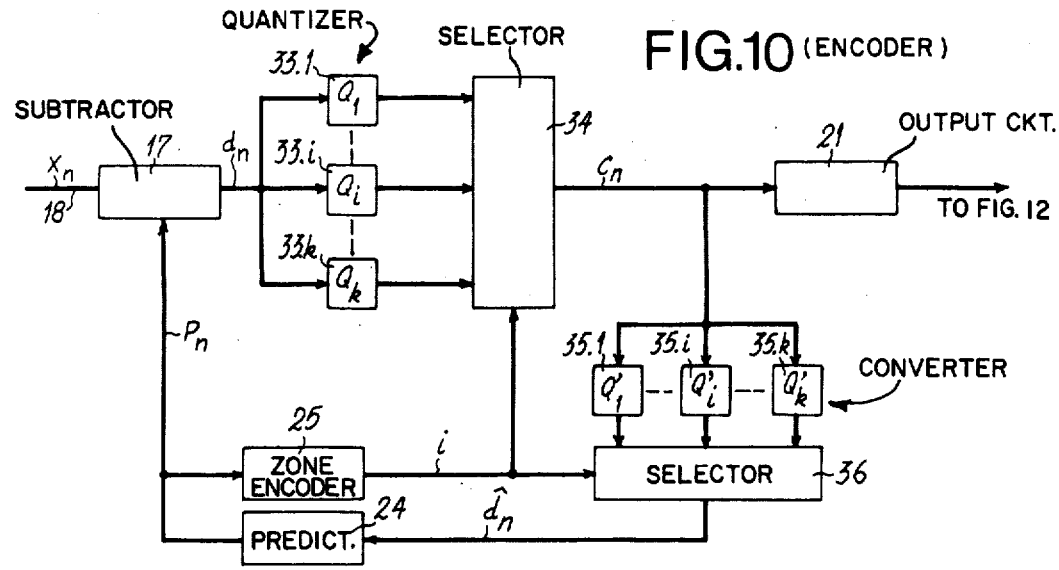
FIG.10 (ENCODER)
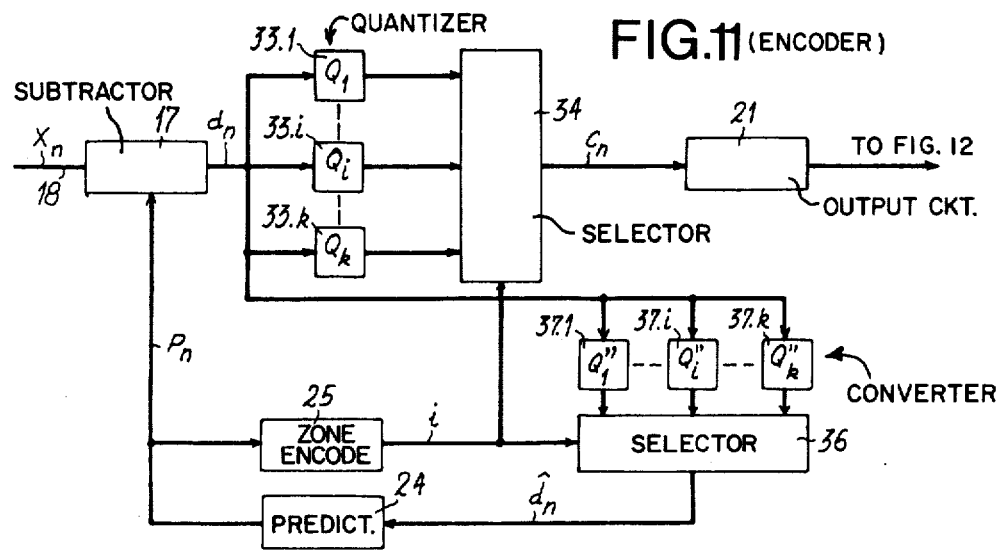
FIG.11 (ENCODER)
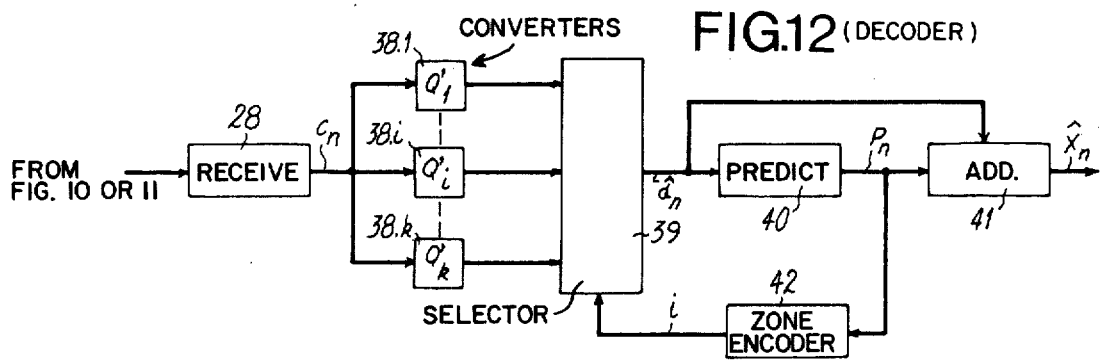
FIG.12 (DECODER)

EXPANSION AND COMPRESSION OF TELEVISION SIGNALS BY USE OF DIFFERENTIAL CODING

This invention relates to the compression and expansion of television numerical signals, through a use of differential coding.

The coding of television signals which are to be processed or transmitted in numerical form and, more especially, the coding using a modulation of differential coded impulses (DPCM) have already been the object of numerous studies. In the French language, this same coding is known as "MICD." A few of the publications describing "DPCM" (or "MICD") are as follows: "Predictive Quantizing Systems (Differential Pulse Code Modulation) for the Transmission of Television Signals"—J. B. O'Neal, "Bell System Technical Journal," vol. 45, pp. 689-721, May, 1976); "A Comparison of Extended Differential Coding Schemes for Video Signals"—H. G. Musmann, Acta of Seminaire de Zurich, 1974;

"Numerical Coding System for Television Image—OCCITAN Project,"—J. Poncin et J. Sabatier, appeared in the French journal "L'Echo des Recherches," January, 1976, pp. 28-37;

"Image Signal Degradation and Subjective Quality in Numerical Coding: Visibility of Contour Wavering-"—F. Kretz et J. L. Boudeville, in the French journal: "Annales des Telecommunications," vol. 31, No. 9-10, September-October, 1976.

In DPCM coding, a code represents the difference between the real value of a television signal sample and an estimation of that value, which estimate is calculated from the preceding, neighboring encoded samples. The differences are classified into zones centered around zero. These zones are limited by numerical values or thresholds. Each difference value, found between two thresholds, is encoded according to a coded combination of a given impulse and of a constant, which corresponds to the zone limited by its two (upper and lower) thresholds. The width of the zones increases with the rank of the zones, when moving away from zero. This makes it possible to obtain a compression in the coding device or an expansion in the decoding device. Thus, small differences are finely encoded in order to prevent the appearance of a granular noise, especially across uniform fields of the image area. On the other hand, that piling up of zones, within small differences, implies that the number of binary or ebs elements are always limited, thus creating a lack of precision in the encoding of the more important differences. When this occurs, the compression characteristics are described as being non-linear.

Generally, the prior art has only used compression characteristics which are symmetrical relative to zero, although this is not necessarily the best solution from the standpoint of the visual effects, as indicated in the third technical article cited above. However, the reconstituted image includes three types of defects:

1. There is a coupling hysteresis effect following the dynamics of the quantizing characteristic of insufficient differences.

2. There is a contour wavering resulting from the different encoding from one line to the other.

3. There is a granular noise which appears in uniform fields of the image, in a manner similar to the source noise.

In practice, it is known that the simple modulation by coded impulses (or MIC) of a television signal, of the usual definition, leads to a prohibitive numerical flow, which is in the order of 120 Meb/s. By separately encoding the components, the DPCM modulation makes possible a reduction of that flow to 45 Meb/s, with a suitable color image quality. However, that flow of 45 Meb/s is excluded, at least in the European standardization plan discussed at the CCITT, relative to the transmission systems. Therefore, it is necessary to plan for a numerical flow which corresponds to the immediately inferior flow of a standardized transmission system, that is to say 34 Meb/s.

It has been found that, by setting the flow at 34 Meb/s, for a 625 line television signal sampled at 8.86 MHz, the above-mentioned defects, in the quality of the image, are insufficient when only a symmetrical characteristic is used.

The second technical article cited above suggests a use of several characteristics which are symmetrical and which are commuted or switched as a function of the local properties of the image. It has been found that, for a flow of 34 Meb/s, there still is not a sufficient image quality.

As indicated in the technical article entitled "Source Encoding with Fixed Word Length and Synchronous Bit Rate" by H. G. Musmann, which appeared in the reports of the "IEEE CHO 601-5 National Television Conference Record" of 1972, pp. 27E-1—27E-6, there has already been a proposal to cause variations in the quantizing characteristic, depending on the prediction value $P_n$, which is made relative to the point which is to be encoded.

One object of the present invention relates to providing for a characteristic which makes it possible to reduce the numerical flow in numerical encoding systems for television images, while preserving a sufficient image quality.

According to a characteristic of the invention, a compression and a corresponding expansion of television numerical signals have differential numerical coding DPCM. The quantizing characteristic is at least partially non-symmetrical relative to zero, and with respect to the number and the values of the thresholds and of the difference reconstruction levels between the real value of a television signal sample and the prediction of what the level was estimated to be.

According to another characteristic, in its non-symmetrical parts, fewer levels are used for the area of the negative differences than for the area or zone of positive differences.

According to yet another characteristic, the invention employs a slope characteristic which decreases more rapidly in the negative zone than in the positive zone.

According to a further characteristic of the present invention, there is a quantizing characteristic which is defined by the number and the values of the thresholds and of the reconstruction levels. This characteristic varies according to the value of a prediction $P_n$, relative to the point which is to be encoded. The variation range of prediction $P_n$ is divided into a number of prediction zones $Z_i$, where i varies from 1 to k. For each prediction zone $Z_i$, there is an associated quantizing characteristic $Q_i$, which is invariable for all of the $X_n$ values of the sample which is to be coded. The prediction value $P_n$ is included in zone $Z_i$, but it is variable from one $Z_i$ zone to the other. Each quantizing characteristic $Q_i$ comprises the same number N of threshold and reconstruction level values. However, there may be extremely different negative levels from one prediction zone $Z_i$ to the other, if the prediction zones $Z_i$ are not symmetrical relative to the half-dynamics of prediction $P_n$.

According to one characteristic, the quantizing characteristics $Q_i$ (thresholds and levels) are non-symmetrical relative to one another and with respect to a point which corresponds to the half-dynamics of $P_n$, the prediction zones $Z_i$ being symmetrical.

According to another characteristic, the quantizing characteristics $Q_i$ are segments of a quantizing characteristic $Q'$, which comprises a number of levels $N'$ which are more important than N.

According to another characteristic, the wide quantizing characteristic $Q'$ is non-symmetrical.

Moreover, it must be well understood that, in the decoding device which receives the encoded signals, there are the same predictive calculations, as in the encoding device. Therefore, there is no additional information which must be transmitted from the encoding device to the decoding device to indicate, to the latter, the number of the prediction zone $Z_i$ for each point.

The above-mentioned characteristics of the invention, as well as others, will appear more clearly upon reading of the following description of quantizing according to the present invention, the description being given relative to the attached drawings, in which:

FIG. 1 is a block diagram of a DPCM encoding device, of a conventional type, which is used to encode television image signals with compression;

FIG. 2 is a block diagram of a conventional DPCM decoding device, which is used to reconstruct the encoded television image signals;

FIG. 4 is a block diagram of a variation of the coding device used in FIG. 1;

FIG. 5 is a block diagram of another variation of an encoding device for use in FIG. 1;

FIG. 6B is a diagram which illustrates a variation of an encoding method, according to the present invention;

FIG. 7 is a block diagram of an encoding device which operates according to the encoding method illustrated in FIG. 6B;

FIG. 8 is a block diagram of a variation of the device shown in FIG. 7, which also operates according to the encoding method illustrated in FIG. 6B;

FIG. 9 is a block diagram of a decoding device capable of decoding the signals received from the encoder of either FIG. 7 or FIG. 8;

FIG. 10 is a block diagram of a circuit of an encoder operating according to the encoding method illustrated in FIG. 6A;

FIG. 11 is a block diagram of a variation of the circuit in FIG. 10 which also operates according to the encoding method illustrated in FIG. 6A; and FIG. 12 is a block diagram of a decoding device circuit capable of decoding signals received from the coding device in either FIG. 10 or FIG. 11.

Figure 3:
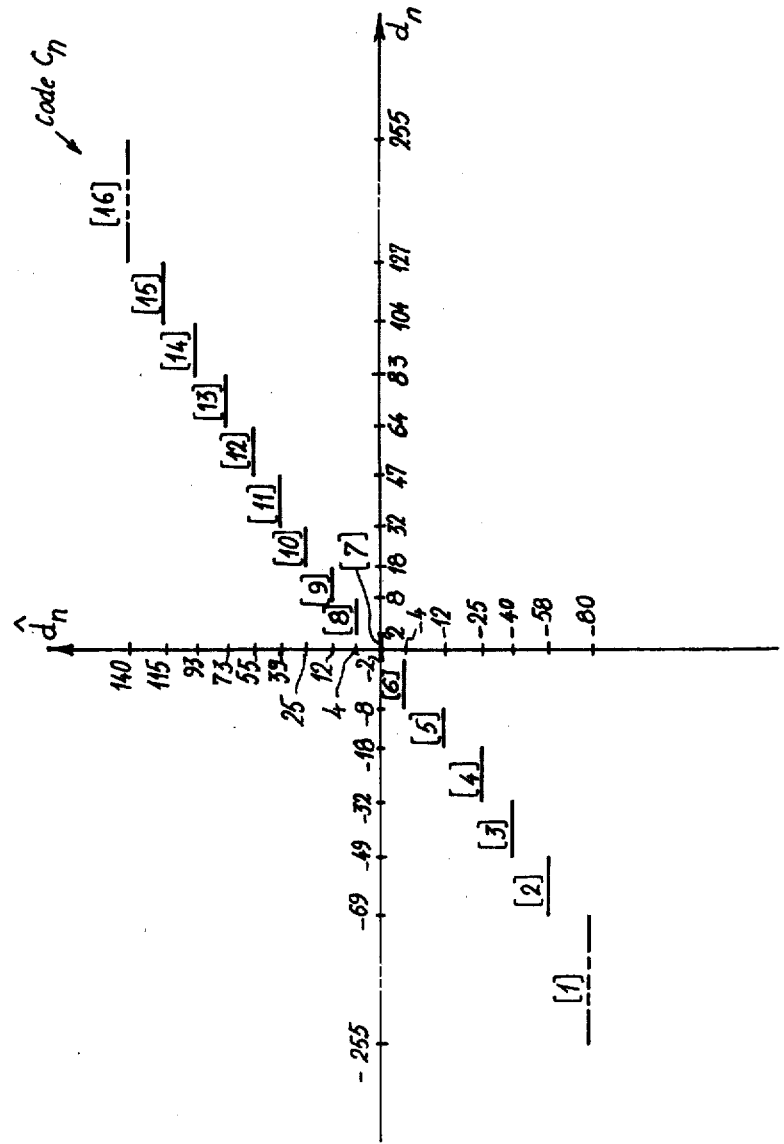
FIG. 3 shows the quantizing characteristic used in the encoding device of FIG. 1, as well as in decoding device in FIG. 2.

The DPCM coding device in FIG. 1 comprises an algebraic subtractor 1, having a first input connected to the signal input 2. The input television image signal appears at terminal 2, to be encoded. The output of subtractor 1 is connected to the input of a quantizing circuit 3, the output of which is connected to an output or utilization circuit 4 (such as, for example, a transmission member) and to a converter 5. The output of converter 5 is connected to the input of a prediction circuit 6, the output of which is connected to a second input of subtractor 1.

In the embodiment which has been described, it is assumed that the television image signal applied to input 2 is in a numerical form $X_n$ and is delivered by a conventional encoding device of the MIC type, which is not shown. Subtractor 1 calculates the difference $d_n$ between the numerical signal $X_n$ and a prediction numerical signal $P_n$ delivered by the prediction circuit 6. Quantizing circuit 3 may be in the form of a read-only encoding memory in which the $d_n$ values delivered by subtractor 1 are considered as addresses corresponding to the DPCM numerical signals $C_n$ applied to circuit 4, which transmits them.

In addition, the numerical signals $C_n$ are also applied to converter 5. Converter 5 may be constituted by a read-only encoding memory in which the values $C_n$ are considered as addresses which correspond to numerical signals $\hat{d}_n$ which, in a conventional manner, constitute the reconstructed differences.

Prediction circuit 6, which may be a conventional one, which has a memory for storing the numerical information signals relative to given points of the image, which precede the current point described by the signal $X_n$. With respect to the prediction formulas which may be used in circuit 6, it may be useful to refer to the second and third technical articles cited above. For each point, circuit 6 delivers the numerical signal of prediction $P_n$.

It will be seen that the law of correspondence between the $d_n$ and $C_n$ values in quantizing device 3 for one part, and the law of correspondence between the $C_n$ and $\hat{d}_n$ values in converter 5, for the other part, form the characteristics of the compression and of expansion (that is to say, of quantizing) of the differences.

In an embodiment of the present invention, the following Table I gives the law of correspondence between the $d_n$ and $C_n$ values:

TABLE I

| $d_n$ Value Ranging Between | | | $C_n$ Value |
|---|---|---|---|
| − 225 | and | − 70 | 1 |
| − 69 | and | − 50 | 2 |
| − 49 | and | − 33 | 3 |
| − 32 | and | − 19 | 4 |
| − 18 | and | − 9 | 5 |
| − 8 | and | − 3 | 6 |
| − 2 | and | 2 | 7 |
| 3 | and | 8 | 8 |
| 9 | and | 18 | 9 |
| 19 | and | 32 | 10 |
| 33 | and | 47 | 11 |
| 48 | and | 64 | 12 |
| 65 | and | 83 | 13 |
| 84 | and | 104 | 14 |
| 105 | and | 127 | 15 |
| 128 | and | 255 | 16 |

Each one of the $C_n$ values corresponds to a band of $d_n$ values which is defined by two thresholds. According to Table I, it seems that the number of bands, on each side of $d_n$ value = zero, is not symmetrical. The widths of those bands are not symmetrical when they are appreciably removed from the zero value.

In table I, it is assumed that an MIC coding is used for the signals which are to be encoded, with 8 binary elements, and with a positive convention. The extreme signal, white, is encoded "255," and the extreme signal, black, is encoded "0." Therefore, in the DPCM coding, a positive value $d_n$ corresponds to an $X_n$ luminance value which is superior to the prediction value $P_n$. That is to say, the $d_n$ value is a point which is whiter than the prediction value would seem to anticipate. A negative $d_n$ value corresponds to a point which is darker than anticipated by the prediction.

The law of correspondence between the $C_n$ and the $\hat{d}_n$ values is indicated in Table II below:

TABLE II

| $C_n$ Value | $\hat{d}_n$ Value |
|---|---|
| 1 | − 80 |
| 2 | − 58 |
| 3 | − 40 |
| 4 | − 25 |
| 5 | − 12 |
| 6 | − 4 |
| 7 | 0 |
| 8 | 4 |
| 9 | 12 |
| 10 | 25 |
| 11 | 39 |
| 12 | 55 |
| 13 | 73 |
| 14 | 93 |
| 15 | 115 |
| 16 | 140 |

It must be noted that, except in the proximity of zero, the $\hat{d}_n$ values are appreciably non-symmetrical. The positive values are more numerous than the negative values, and they reach higher values than do the negative values.

The values indicated in Tables I and II have been chosen as a result of subjective tests. It is evident that the values for the reconstruction thresholds and levels could vary somewhat, for example by approximately 25% for those values which are distant from zero, and by ±4 units for the values which are close to zero. FIG. 3 represents the compression and expansion characteristics (i.e., the quantizing characteristics) which can be derived from Tables I and II.

It is evident that, with conventional negative MIC-type encoding, it would be necessary to invert the sign $d_n$. Moreover, when an MIC type encoding is used in a more general manner, with n elements for $X_n$ (instead of 8 binary elements) as assumed in Tables I and II, and values indicated for the reconstruction thresholds and levels must be multiplied by $2^{n-8}$ and, possibly, rounded to the whole number of the inferior module.

The DPCM decoding device in FIG. 2 comprises a reception member 7 which receives the numerical signals transmitted by the transmission member 4 in FIG. 1 and which delivers the received $C_n$ signals to a converter circuit 8. The output of converter 8 is connected on one side to a prediction circuit 9 and on the other side to the first input of an adding circuit 10. The output of prediction circuit 9 is connected to the second input of adding circuit 10. Following a numerical-analogical conversion, circuit 10 delivers the reconstituted signal $\hat{X}_n$ to a television receiver (not shown). Therefore, the decoding device in FIG. 2 is fairly conventional. The converter 8 is identical to the prediction device 6 in FIG. 1. Therefore, converter 8 delivers the numerical signals $\hat{d}_n$, while prediction device 9 delivers numerical signals $P_n$. In the adder 10, the addition of $\hat{d}_n$ and of $P_n$ gives the reconstructed value $\hat{X}_n$.

The DPCM encoding device in FIG. 4 constitutes a variation of the circuit in FIG. 1. It comprises a subtracting circuit 1 which receives the signal $X_n$ to be encoded, on its first input, and the prediction signal $P_n$ on its second input. The output of circuit 1 is connected to the input of a conventional circuit 11, for delivering at its first output the absolute value of the numerical signal which is received at its input, and at its second output the sign of the numerical signal. The first output of circuit 11 is connected, in parallel with the address inputs of two read-only memories 12 and 13. The data output of memory 12 is connected to the first terminal of an inverter 14, while the data output of memory 13 is connected to the second terminal of inverter 14. The sign output of circuit 11 is connected to the control input of inverter 14. The "movable" terminal, represented by a contact, of inverter 14 is connected on one side to transmission member 4 and, on the other side, to the input of converter 5. The output of converter 5 is connected to the input of the prediction device 6, the output of which is connected to a second input of subtractor 1. Thus, in FIG. 4, the complex formed by circuits 11 to 12 replaces the quantizer circuit 3 of FIG. 1.

The first output of circuit 11 delivers the absolute value $|d_n|$. Memory 12 uses the absolute values which are applied to it, as addresses, to deliver seven to sixteen $C_n$ values according to the upper part of Table I. Depending on whether the sign of $d_n$ has a positive or a negative value supplied by circuit 11, inverter 14 switches the output of memories 12 or 13 toward output circuit 4 and converter 5. Thus, the function of memory 3 in FIG. 1 is provided.

The DPCM coding device in FIG. 5 constitutes another embodiment of the circuit in FIG. 1. Instead of memory 3, FIG. 5 uses a group of fifteen comparing devices, 15.1 to 15.15, the respective inputs of which are connected in parallel to the output of subtractor 1. The outputs of these comparing devices are connected to the corresponding inputs of a transcoding device 16 (which includes read-only memory functions). Comparing devices 15.1 to 15.15 determine the limits of the $d_n$ zones indicated in the first column in Table I. The result of this comparison is deduced in transcoding device 16 which delivers the numerical signals $C_n$. The details of the comparing devices and those of the transcoding device are conventional in the information processing art.

Figure 6A:
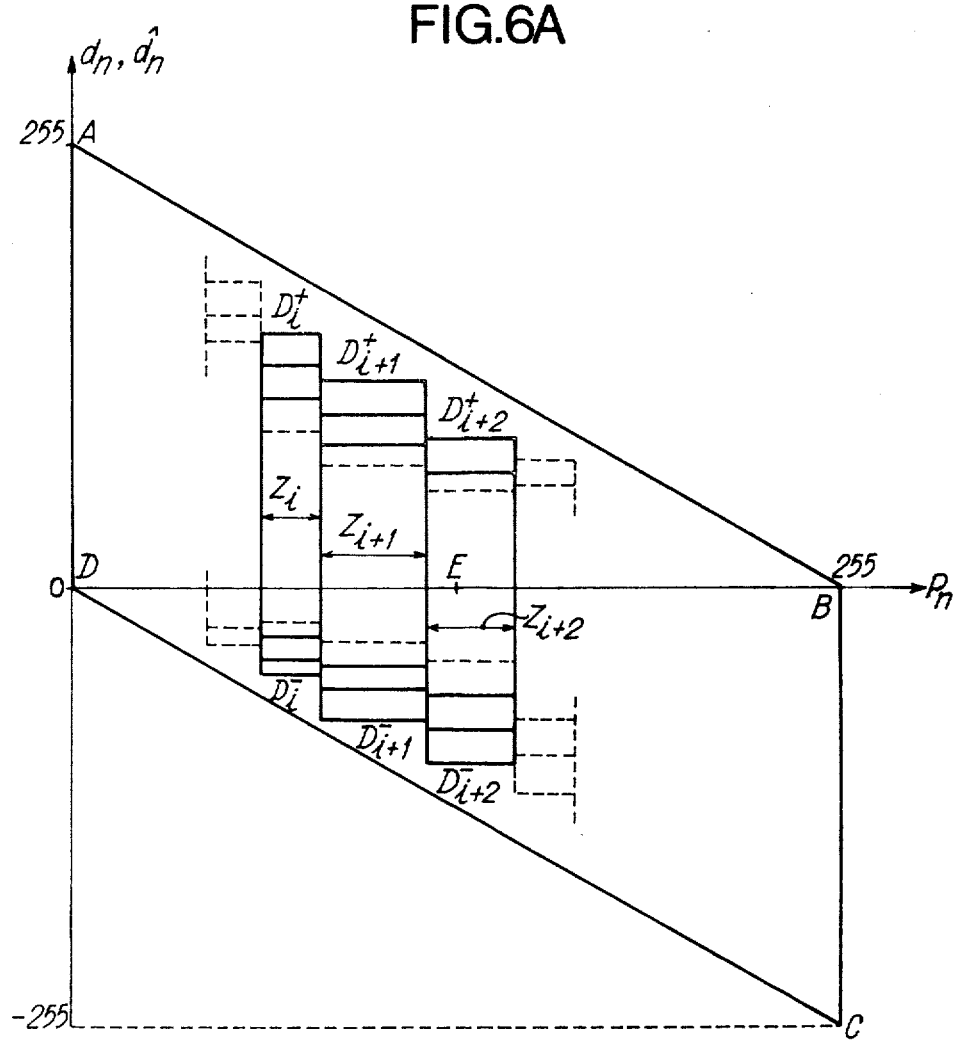
FIG. 6A is a diagram which illustrates an encoding method, according to the present invention.

FIG. 6A represents prediction zones $Z_i$ in a system of coordinates with the prediction value $P_n$, in the abscissa, and the values $d_n$ and $\hat{d}_n$ in the ordinate. It is assumed that $P_n$ may take any value between 0 and 255, this corresponding to an 8-binary element MIC-type coding. Therefore, $d_n$ and $\hat{d}_n$ may take any value ranging between −255 and +255, in case of a positive convention.

In the method illustrated in FIG. 6A, the $C_n$ coding zones are a function both of $d_n$ and of $P_n$, while the $\hat{d}_n$ reconstruction levels also are a function of $C_n$ and of $P_n$ before the following simplification. In each prediction zone $Z_i$, i varies from 1 to k, and the quantizing characteristic is invariable, this being translated by the formulas:

$$C_n = f(d_n, i) \text{ and } \hat{d}_n = g(C_n, i)$$

when $P_n$ is in the prediction zone $Z_n$.

It can be seen that the juxtaposed zones $Z_i$ to $Z_k$ cover the DB axis of the ABCD parallelogram, the sides of which represent the theoretical limits of the prediction error $d_n = X_n - P_n$ as a function of $P_n$. In practice, those limits are never reached. The $d_n$ values in each zone $Z_i$ may be limited to values which are inferior in absolute amounts, such as $D_i{}^+$ and $D_i{}^-$. As shown in FIG. 6A, the zones $Z_i$ are variable in width, and the extreme levels $D_i{}^+$ and $D_i{}^-$ are also variable. It will also be noted that the different reconstruction levels and thresholds in the zones do not coincide from one zone to the adjacent zone. Besides, zones $Z_i$ are not symmetrical with respect to point E which is located on the abscissa axis, in the middle of line DB. Point E marks the mid-scale point or half-dynamics of the range through which $P_n$ may vary. Even though the zones are symmetrical with respect to the point E, the quantizing characteristics $Q_i$ (thresholds and levels) are not symmetrical with respect to one another, relative to mid-scale point E.

In each $Z_i$ zone, there are N levels, including $D_i{}^+$ and $D_i{}^-$ which are not symmetrical relative to the point of the ordinate which is zero ($d_n = 0$). Preferably, these levels are distributed in a manner similar to the distribution of the 16 levels in FIG. 3. The value N may be equal to 16, corresponding to the $C_n{}^i$ codes to words of 4-binary elements.

FIG. 6A especially shows three zones $Z_i$, $Z_{i+1}$ and $Z_{i+2}$, the widths of which are obviously different. This is simply given as an example.

In practice, the widths and the distribution of zones $Z_i$ depend on the abscissa axis, the $D_i{}^+$ and $D_i{}^-$ values, and the quantizing characteristics $Q_i$, which are determined by experience and chosen by the following objective tests.

FIG. 6B represents prediction zones $Z_j$ in an ABCD parallelogram which is identical to the one in FIG. 6A. As with zones $Z_i$ (FIG. 6A), the zones $Z_j$ (FIG. 6B) are adjacent, have different widths, are distributed in a non-symmetrical manner relative to mid-scale point E, and cover most of rectangle ABCD. However, they are different with respect to the distribution of the thresholds. Indeed, the thresholds N of each quantizing characteristic of each zone $Z_j$ are chosen from among the N' thresholds of a wide, extended, broad, or principal quantizing characteristic converting the field of variation. The threshold N' is definitely greater than the threshold N. The N thresholds taken in the wide characteristic to form the N thresholds of a zone $Z_j$ are consecutive. From this, it is apparent that the extreme reconstruction levels $D_j{}^+$ and $D_j{}^-$ of a zone $Z_j$ correspond to levels of the wide quantizing characteristic which are separated by levels N-2.

Thus, in FIG. 6B, the reconstruction levels and the encoding zones constitute a partial quantizing characteristic $Q_j$ of the wide quantizing characteristic $Q'$. Therefore, this DPCM encoding method, with prediction zones, brings back to saturation levels $D_j{}^+$ and $D_j{}^-$ (specific to the prediction zone), in each zone $Z_j$, the reconstruction levels of a wide quantizing characteristic $Q'$ which are external to them. The coding zones associated with those masked levels are eliminated.

The wide quantizing characteristic $Q'$ is defined by the following subjective tests, as are zones $Z_j$ and the saturation levels $D_j{}^+$ and $D_j{}^-$. The quality of the image obtained by encoding the prediction zones in FIG. 6B normally is close to the quality which would be given by the DPCM coding with a single quantizing factor defined by a characteristic $Q'$. Of course, the advantage is that, for practically equal levels of quality, the coding with prediction zones requires only N words, instead of N' words, to ensure transmission. With transmitted words of the same length, it is possible to obtain a clearly superior image quality, since everything takes place as if the number of levels were doubled.

Preferably, an unsymmetrical form is chosen for the wide quantizing characteristic $Q'$. In addition, the prediction zones $Z_j$ are non-symmetrical with respect to the point E. Since the characteristic $Q'$ is not symmetrical, the whole complex of the positive saturation values $D_j{}^+$ is not symmetrical relative to the complex of the negative saturation values $D_j{}^-$, with respect to point E.

However, a slightly sub-optimum method makes use of a symmetrical, wide quantizing characteristic. Neither the prediction zones $Z_j$ nor the complexes of positive and negative saturation values are symmetrical with respect to point E.

The following Tables III and IV give the numerical values of an example of such a slightly sub-optimum method. The wide quantizing characteristic is defined in Table III. It comprises thirty-one $C'_n$ codes. The prediction zones and the saturation values are defined in Table IV. In that example, the numerical flow is 4 ebs per point. An objective is to provide an encoding of television signals at 34 Meb/s. It has been possible, during tests, to observe that the subjective quality of the presented image was better than the quality which can be obtained with a quantizing characteristic with sixteen levels, without any masking action according to the prediction zone. An examination of Tables III and IV further shows that prediction zones have been added, close to the extreme values 0 and 255, so that the saturation values $D_j{}^+$ and $D_j{}^-$ will always be inside parallelogram ABCD, regardless of the value of $P_n$. That process makes it possible to eliminate the overflow correction which is conventionally necessary to make a calculation of the prediction. It must be noted that the same process may be used in the method illustrated in FIG. 6A.

TABLE III

Values of the thresholds, of the codes and of the reconstruction levels of the wide quantizing characteristic

| $d_n$ Values (Thresholds) | | | $C_n$ Codes | Reconstruction Level $d_n$ |
|---|---|---|---|---|
| − 255 | to | − 231 | 1 | − 245 |
| − 230 | to | − 202 | 2 | − 215 |
| − 201 | to | − 176 | 3 | − 188 |
| − 175 | to | − 153 | 4 | − 163 |
| − 152 | to | − 131 | 5 | − 141 |
| − 130 | to | − 110 | 6 | − 119 |
| − 109 | to | − 91 | 7 | − 99 |
| − 90 | to | − 74 | 8 | − 81 |
| − 73 | to | − 58 | 9 | − 65 |
| − 57 | to | − 44 | 10 | − 50 |
| − 43 | to | − 32 | 11 | − 37 |
| − 31 | to | − 20 | 12 | − 25 |
| − 19 | to | − 11 | 13 | − 14 |
| − 10 | to | − 4 | 14 | − 6 |
| − 3 | to | − 1 | 15 | − 2 |
|  | 0 |  | 16 | 0 |
| 1 | to | 3 | 17 | 2 |
| 4 | to | 10 | 18 | 6 |
| 11 | to | 19 | 19 | 14 |
| 20 | to | 31 | 20 | 25 |
| 32 | to | 43 | 21 | 37 |
| 44 | to | 57 | 22 | 50 |
| 58 | to | 73 | 23 | 65 |
| 74 | to | 90 | 24 | 81 |
| 91 | to | 109 | 25 | 99 |

TABLE III-continued

Values of the thresholds, of the codes and of the reconstruction levels of the wide quantizing characteristic

| $d_n$ Values (Thresholds) | | | $C_n$ Codes | Reconstruction Level $d_n$ |
|---|---|---|---|---|
| 110 | to | 130 | 26 | 119 |
| 131 | to | 152 | 27 | 141 |
| 153 | to | 175 | 28 | 163 |
| 176 | to | 201 | 29 | 188 |
| 202 | to | 230 | 30 | 215 |
| 231 | to | 255 | 31 | 245 |

TABLE IV

Limits of the prediction zones, zone number and positive and negative saturation level

| $P_n$ Values (Limits of Zones) | Zone No. | Positive Saturation Level | Negative Saturation Level |
|---|---|---|---|
| 0 to 1 | 1 | 245 | 0 |
| 2 to 9 | 2 | 215 | − 2 |
| 10 to 23 | 3 | 188 | − 6 |
| 24 to 49 | 4 | 163 | − 14 |
| 50 to 73 | 5 | 141 | − 25 |
| 74 to 95 | 6 | 119 | − 37 |
| 96 to 112 | 7 | 99 | − 50 |
| 113 to 132 | 8 | 81 | − 65 |
| 133 to 148 | 9 | 65 | − 81 |
| 149 to 165 | 10 | 50 | − 99 |
| 166 to 192 | 11 | 37 | − 119 |
| 193 to 220 | 12 | 25 | − 141 |
| 221 to 241 | 13 | 14 | − 163 |
| 242 to 249 | 14 | 6 | − 188 |
| 250 to 253 | 15 | 2 | − 215 |
| 254 to 255 | 16 | 0 | − 245 |

FIG. 7 gives one example of an embodiment of an encoding device having a wide characteristic, which operates according to the method illustrated in FIG. 6B. The encoding device comprises an algebraic type subtractor 17. The first input of subtractor 17 is connected to the signal input 18 where the television signals are applied to be encoded, and the output of which is connected to the input of a quantizing circuit 19. The output of quantizer circuit 19 is connected to the input of a reducing-transcoding device 20. The output of device 20 is connected, on one side, to an output or utilization circuit 21, such as a transmission member for example and, on the other side, to a transcoding device 22, which is the reverse of transcoding device 20. The output of transcoding device 22 is connected to the input of a converter 23, the output of which is connected to the input of a prediction circuit 24. The output of circuit 24 is connected to a second input of the subtractor 17. The output of prediction device 24 is also connected to the input of a prediction zone coding device 25. The output of device 25 is connected for one part to the control input of transcoding device 20 and, for the other part, to the control input of transcoding device 22.

In the embodiment which is described, it is assumed that the television image signal applied to input 18 is in the numerical form $X_n$ and is delivered by a conventional MIC coding device (not shown). Subtractor 17 calculates the difference $d_n$ between the numerical signal $X_n$ and a prediction numerical signal $P_n$ delivered by the prediction device 24. Quantizing circuit 19 may be constituted by a read-only coding memory in which the $d_n$ values are considered as addresses which correspond to the numerical signals $C_n$ in number k', depending on the wide quantizing characteristic Q'. If the wide characteristic corresponds to Table III, there are thirty-one $C'_n$ signals possible. Besides, coding device 25 delivers, as a function of the numerical signal value $P_n$, a numerical signal i, which defines the extreme white and black values of codes, $C'_{n'}$, that is to say, the values $C_i^+$ and $C_i^-$ ($C_i^- \geq C'_n \geq C_i^+$). The output of transcoding device 20 may be transmitted as a level difference signal which is equal to $(C'_n{}^+ - C_i^-)$. When $C'_n < C_i^-$ transcoding device 20 delivers a signal having the value of 0. When $C'_n > C_i^+$ transcoder 20 delivers a signal having the value of k, k being equal to 15, in the example being described. It has been indicated that transcoding device 20 delivers the $C_n$ codes which correspond to those values. Those codes are applied to the output circuit 21 which transmits them.

Besides, the $C_n$ numerical signals are also applied to transcoder 22, the control input of which also receives the value i. Transcoder 22 performs an operation which is the reverse of the operation performed by transcoding device 20. That is to say, in the above example, it adds the value $C_i^-$ to signal $C_n$ received from transcoder 20, in order to deliver a signal $\hat{C}'_n$. It must be noted that, if the value $C'_n$ falls within the interval $C_i^-$, $C_i^+$ defined in transcoder 20 by the value delivered by the zone prediction circuit 25, the value $\hat{C}'_n$ delivered by transcoder 22 is identical with the valve $C'n'$ because the reverse transcoding device 22 receives the same signal i from the zone prediction circuit 25.

The numerical signals $\hat{C}'_n$ are applied to converter 23, which may be constituted by a decoding memory in which the $\hat{C}'_n$ values are considered as addresses which correspond to numerical signals which conventionally constitute the reconstructed differences. The prediction circuit 24 may be conventional. The prediction circuit delivers, for each point, the prediction numerical signal $P_n$.

Signal $P_n$ is applied in a conventional manner to the second input of subtractor 17, and to the input of coding device 25, which may be a simple level discriminating device operated responsive to the numerical signal levels. If the values given in Table IV are considered, it appears that for a $P_n$ value ranging between 0 and 255, there is a zone i corresponding to a number ranging between 1 and 16, inclusive. The zone-predicting device 25 may be a very simple decoding memory, as may be quantizer 19 and converter 23.

The coding device in FIG. 8 constitutes a variation of that represented in FIG. 7. It also comprises subtractor 17, quantizer 19, transcoder 20, output circuit 21, and predictors 24 and 25 which operate as in the coding device in FIG. 7. The transcoder circuit 22 and converter 23 are replaced by encoder 26 and limiter 27. Circuit 26 has its signal input connected to the output of subtractor 17, and its signal output connected to the signal input of limiter 27, the output of which is connected to the input of prediction device 24. The control input of limiter circuit 27 is connected to the output of zone coding device 25. Circuit 26 is an encoding device which delivers, as a function of the numerical signal $d_n$ which is applied to it, another numerical signal $d'_n$, following a correspondence table which, for example, may be that in Table III. In practice, circuit 26 may be a read-only memory in which the numerical values of the $d'_n$ signals are directly recorded at addresses $d_n$. The limiter circuit 27 is a device which limits the $d'_n$ values at the extreme positive $D_i^+$, and negative $D_i^-$ values, which are defined as a function of i according to Table IV. Therefore, limiter 27 delivers a numerical signal $\hat{d}_n$ which is identical with the signal delivered by converter 23 in FIG. 7. In practice, circuit 27 may also be a read-only memory which contains the values $D_i^+$ and $D_i^-$, associated with two logical comparing devices.

The DPCM decoding device in FIG. 9 receives encoded signals, according to the method illustrated in FIG. 6B. That is to say, it receives signals emitted by the encoding device represented in either FIG. 7 or FIG. 8. FIG. 9 comprises a receiving member 28 which receives the numerical signals transmitted by the output or transmission member 21 shown in either FIG. 7 or FIG. 8. The receive circuit 28 delivers the $C_n$ received signals to a converter circuit 29. The output of converter 29 is connected, for one part, to a prediction circuit 30 and, for the other part, to the first input of an algebraic adding device 31. The output of prediction device 30 is connected to the second input of adding device 31 for one part, and to the input of a zone encoding device 32 for the other part. The output of the encoding device 32 is connected to the control input of converter 29.

In practice, the converter circuit 29 (FIG. 9) comprises, in series, a transcoder circuit 22 and a converter circuit 23 (FIG. 7). As described in connection with converter 23, the converter circuit 29 delivers the same signal as converter 23 delivers, i.e., a $\hat{d}_n$ signal. The prediction device 30 is identical with prediction device 24. Circuit 30 delivers the same $P_n$ signal which is applied to the encoding device 32, which is identical to the zone encoder 25. Circuit 32 delivers the same i code for indicating the prediction zone. It can be seen clearly, then, that by performing the same numerical operations in the encoding device and in the decoding device, it is not necessary to transmit in line any information other than $C_n$. Of course, at the beginning of each television image line, and possibly at the beginning of each image when the prediction device is two-dimensional, any suitable means (not shown) places the encoding and the decoding devices into the same starting (initial) conditions.

Finally, the adding device 31 sums up $P_n$ and $\hat{d}_n$ in the conventional manner. This operation gives the reconstructed value $\hat{X}_n$ which, after a numerical-analogical conversion, is applied to a television-receiving set (not shown).

FIG. 10 shows one example of an execution of an encoding device, with switching of the quantizing characteristics, which operates according to the method illustrated in FIG. 6A. That encoding device comprises an algebraic subtractor 17, one input of which receives the $X_n$ signal, and the other the predicted signal $P_n$. The output of subtractor 17 is connected in parallel to the quantizer inputs 33.1 to 33.$k$, which respectively have quantizing characteristics $Q_1$ to $Q_k$. The outputs of quantizers 33.1 to 33.$k$, respectively, are connected to the inputs of a selector 34, the output of which is connected for one part to an output circuit or transmission member 21 and, for the other part, in parallel to the inputs of converters 35.1 to 35.$k$. The outputs of converters 35.1 to 35.$k$ are respectively connected to the inputs of a selector 36, the output of which is connected to the input of prediction device 25. The output of the encoding device 25 is connected, in parallel, to the control inputs of selectors 34 and 36.

Each quantizing device 33.$i$ has its own $Q_i$ characteristic. That is to say, a function of $d_n$ is applied to the corresponding input of selector 34 as a signal $C_n$. Selector 34 is governed by the output of zone encoder 25 which chooses one of the input signals in order to deliver it as the signal $C_n$, as in FIG. 7. Besides, all converters 35.1 to 35.$k$ which receive the signal $C_n$ deliver, as a function of their opposite characteristics $Q'_1$ to $Q'_k$, the signals $\hat{d}_n^i$. Selector 36 is governed by the output of zone encoder 25, which chooses the rank i output to transmit it, thus giving $\hat{d}_n$.

The coding device in FIG. 11 is a variation of that shown in FIG. 10. Again, there are found the circuit subtractor 17, quantizers 33.1 to 33.$k$, selector 34, output circuit 21, predictor 24, zone encoder 25 and selector 36, but the converters 35.1 to 35.$k$ are replaced, in FIG. 11, by the converters 37.1 to 37.$k$. The respective inputs of converters 37.1 to 37.$k$ are connected in parallel to the output of subtractor 17. Thus, as in the encoding device in FIG. 10, the signal $d_n$ is directly converted into $\hat{d}_n^i$ signals, according to a Table (not shown) which is similar to Table III. The operation of selectors 34 and 36 is the same as previously described.

In fact, this encoding method, illustrated in FIG. 6A, consists in having available as many different quantizing characteristics $Q_i - Q_i$ as there are prediction zones. Each one of them has the same number N of codes, as in the coding devices of FIGS. 7 and 8. We have here a simple technical variation over the method of operation of the encoding devices in FIGS. 7 and 8. However, if the N codes are suited for each prediction zone, independently from those of the other zones, it is possible to follow more closely the experimental results, and thus to obtain a slightly superior quality for a same number of codes.

FIG. 12 shows a decoding device capable of receiving the signals which are transmitted from the output circuit or member 21 in FIGS. 10 and 11. The circuit of FIG. 12 comprises a receiving member 28, the output of which is connected, in parallel, with the inputs of converters 38.1 to 38.$k$, which are identical with converters 35.1 to 35.$k$. The outputs of converters 38.1 are connected to the inputs of a selector 39 which is identical with selector 36. The output of selector 39 is connected, for one part to the input of a prediction device 40, which may be identical with the predictor 24 and, for the other part, to an input of an adding device 41. The output of prediction device 40 is connected, for one part, to the second input of adding device 41 and, for the other part, to the input of a zone encoding device 42, which may be identical with the zone encoder 25, the output of which is connected to the control input of selector 39.

The receive member 28 delivers the $C_n$ signals. As with the selector 36, the selector 30 delivers the signals $\hat{d}_n$. Prediction device 40 delivers the $P_n$ signals and, therefore, the zone encoder circuit 42 delivers the same i code as encoder 25 delivers. Adding device 41 delivers signal $\hat{X}_n$ which is converted before it is applied to a television set (not shown).

The appended claims are to be construed broadly enough to cover not only all of the above-described embodiments, but also all other modifications falling within the true scope and spirit of the invention.

We claim:

1. A method of compressing and expanding numerical television signals with DPCM differential coding, said method comprising the steps of:

a. predicting an estimate of what a television signal should be;

b. at least partially quantizing said signals with a quantizing characteristic which is non-symmetrical relative to zero; and c. modifying said quantized signals with respect to the value of a predetermined reconstruction threshold and to the levels of the differences between the actual value of a television signal sample and the value predicted in step a.

2. The method of compression and expansion according to claim 1, characterized in that, in its non-symmetrical parts, said quantizing characteristic comprises fewer levels for the area of the negative differences than it does for the area of the positive differences, when the signal to be encoded is of the positive convention type.

3. The method of compression and expansion according to claim 2 further characterized in that said quantizing characteristic has a slope which decreases more rapidly in the negative area than in the positive area, when the signal to be encoded is of the positive convention type.

4. The method of compression and expansion according to claim 1, characterized in that, in its non-symmetrical parts, said quantizing characteristic comprise fewer levels for the area of the positive differences than it does for the area of the negative differences, when the signal to be endoded is of the negative convention type.

5. The method of compression and expansion according to claim 4 further characterized in that said quantizing characteristic has a slope which decreases more rapidly in the positive area than in the negative area, when the signal to be encoded is of the negative convention type.

6. The method of compression and expansion according to any one of the claims 1 to 3, characterized in that the quantizing characteristic of an MIC-type coding signal with 8 binary elements, and of the positive convention type, corresponds to Tables I and II below:

TABLE I

| $d_n$ Value Ranging Between | | | $C_n$ Value |
|---|---|---|---|
| − 225 | and | − 70 | 1 |
| − 69 | and | − 50 | 2 |
| − 49 | and | − 33 | 3 |
| − 32 | and | − 19 | 4 |
| − 18 | and | − 9 | 5 |
| − 8 | and | − 3 | 6 |
| − 2 | and | 2 | 7 |
| 3 | and | 8 | 8 |
| 9 | and | 18 | 9 |
| 19 | and | 32 | 10 |
| 33 | and | 47 | 11 |
| 48 | and | 64 | 12 |
| 65 | and | 83 | 13 |
| 84 | and | 104 | 14 |
| 105 | and | 127 | 15 |
| 128 | and | 255 | 16 |

TABLE II

| $C_n$ Value | $\hat{d}_n$ Value |
|---|---|
| 1 | − 80 |
| 2 | − 58 |
| 3 | − 40 |
| 4 | − 25 |
| 5 | − 12 |
| 6 | − 4 |
| 7 | 0 |
| 8 | 4 |
| 9 | 12 |
| 10 | 25 |
| 11 | 39 |
| 12 | 55 |
| 13 | 73 |
| 14 | 93 |
| 15 | 115 |
| 16 | 140 | in which $d_n$ is the difference between the value of the signal to be encoded and the value estimated in step a., $C_n$ is the decimal value which corresponds to the DPCM code value, and $\hat{d}_n$ is the reconstructed difference, the values of the thresholds and of the levels of reconstruction being given at ±25% for those values which are remote from the zero, and at ±4 units for those values which are close to zero.

7. The method of compression and expansion according to claim 6 further characterized in that the quantizing characteristic of a signal with MIC coding and with 8 binary elements and negative convention, corresponds to said Tables I and II, in which the signs of $d_n$ and of $\hat{d}_n$ are reversed.

8. The method of compression and expansion according to claim 7 wherein the MIC signal to be processed contains n binary elements characterized in that the values of the reconstruction thresholds and levels in said Tables I and II are multiplied by $2^{n-8}$.

9. A method of compressing and expanding television numerical signals with DPCM differential coding, said method comprising the steps of:

a. predicting the value $P_n$ of the signal based upon the value of previous signals, the range of variation of the prediction $P_n$ being divided into prediction zones $Z_i$ where i varies from 1 to k, for each prediction zone $Z_i$ which is associated with a quantizing characteristic $Q_i$, which is invariable for all values $X_n$ of samples to be encoded responsive to the prediction value $P_n$ which is included in zone $Z_i$, said quantizing characteristic varying from one zone $Z_i$ to another;

b. quantizing said signals based upon a characteristic which is defined by the number and the values of the thresholds and of the reconstruction levels, the quantizing characteristic of the signal varying according to the prediction value relative to a point which is to be encoded, each quantizing characteristic comprising the same number of threshold and reconstruction level values M, with negative and positive extreme levels which are different from one prediction zone $Z_i$ to another; and c. the prediction zones $Z_i$ being non-symmetrical with respect to the half-dynamics of said prediction $P_n$.

10. The method of compression and expansion according to claim 9, characterized in that said quantizing characteristics $Q_i$ are non-symmetrical in relation to one another, and with respect to a point which corresponds to the half-cynamics of $P_n$, the prediction zones $Z_i$ being symmetrical.

11. The method of compression and expansion according to one of the claims 9 or 10, characterized in that the quantizing characteristics $Q_i$ are segments of a quantizing characteristic Q', which has a number N' of levels which are more important than N.

* * * * *